(12) United States Patent
Obata et al.

(10) Patent No.: US 8,215,983 B2
(45) Date of Patent: Jul. 10, 2012

(54) ELECTRONIC DEVICE

(75) Inventors: Shinya Obata, Nagoya (JP); Hiromitsu Itono, Nagoya (JP); Yoshio Ejiri, Nagoya (JP)

(73) Assignee: Buffalo Inc., Nagoya-Shi (JP)

( * ) Notice: Subject to any disclaimer, the term of this patent is extended or adjusted under 35 U.S.C. 154(b) by 0 days.

(21) Appl. No.: 12/814,373

(22) Filed: Jun. 11, 2010

(65) Prior Publication Data

US 2011/0008980 A1   Jan. 13, 2011

(30) Foreign Application Priority Data

Jun. 15, 2009 (JP) ................................ 2009-142072
Aug. 18, 2009 (JP) ................................ 2009-189171

(51) Int. Cl.
*H01R 13/62* (2006.01)
(52) U.S. Cl. ...................................................... 439/528
(58) Field of Classification Search .............. 439/501, 439/528
See application file for complete search history.

(56) References Cited

U.S. PATENT DOCUMENTS

| 5,691,882 | A | * | 11/1997 | Ma | 361/679.32 |
| 6,705,890 | B2 | * | 3/2004 | Kitou et al. | 439/528 |
| 6,926,554 | B2 | * | 8/2005 | Liow et al. | 439/528 |
| 7,467,971 | B2 | * | 12/2008 | Lin et al. | 439/501 |
| 7,746,029 | B2 | * | 6/2010 | Toya | 320/107 |
| 2010/0055981 | A1 | * | 3/2010 | Yang | 439/620.21 |

FOREIGN PATENT DOCUMENTS

JP   2009-21452   1/2009

* cited by examiner

*Primary Examiner* — Phuong Dinh
(74) *Attorney, Agent, or Firm* — Beyer Law Group LLP

(57) ABSTRACT

An electronic device comprises a casing. The casing has a groove formed along the periphery of the casing and designed to receive a connection cable having a flat cross-section therein, in such a manner that no part of the received connection cable protrudes beyond the brims of the groove; and a retainer adapted to retain a first connector attached to one end of the connection cable while the connection cable is being received in the groove. The design affords improved external appearance and ease of handling in relation to the connection cable of the electronic device.

16 Claims, 6 Drawing Sheets

ELECTRONIC DEVICE

CROSS-REFERENCE TO RELATED APPLICATION

The present application claims priority from Japanese application P2009-189171A filed on Aug. 18, 2009, and Japanese application P2009-142072A filed on Jun. 15, 2009, the contents of which are hereby incorporated by reference into this application.

BACKGROUND

1. Field of the Invention

The present invention relates to an electronic device having a casing, and in particular to a technique of accommodating a connection cable for the electronic device.

2. Description of the Related Art

Recent advances in size reduction of electronic devices have made possible the development of various electronic devices that are portable. One example of such electronic devices is the portable hard disk. A portable hard disk can be taken by the user to a desired location, where it can be used for example by being connected to a personal computer situated at that location, using a connection cable such as a USB (Universal Serial Bus) cable. When transporting such a portable hard disk, the connection cable is sometimes coiled around the portable hard disk in an appropriate manner for transport.

In this regard, JP-A-2009-21452 discloses a technique for securing a connection cable by clipping the connection cable below several projecting portions that are disposed on the portable hard disk casing, while providing the connector attached to the end of the connection cable with a hooked shape designed to be secured with the hooked shape fitting into a recess in the casing.

According to this technique, because the connection cable is secured with the cable at least partially protruding out beyond the outside edge of the casing, the connection cable is protruding and poses a risk of the projecting portions becoming caught on a projection of some other object; accordingly, there was a need for enhanced ease of handling for the user. There was also a need for improved external appearance. This issue is not limited to portable hard disks, but is rather an issue common to all manner of electronic devices that are designed to be transported together with a connection cable.

SUMMARY

At least partly in view of the foregoing issue, it is an object of the present invention to provide improved external appearance and/or ease of handling of a connection cable for an electronic device.

The present invention has been made to attaining the above objects at least in part according to the following aspects of the invention.

One aspect of the present invention is directed to an electronic device housed in a casing. The electronic device comprises a casing. The casing has a groove formed along the periphery of the casing and designed to receive a connection cable having a flat cross-section therein, in such a manner that no part of the received connection cable protrudes beyond the brims of the groove, and a retainer adapted to retain a first connector attached to one end of the connection cable while the connection cable is being received in the groove.

According to the electronic device having this feature, with the connection cable received in the groove that is formed along the periphery of the casing and the connector attached to the end of the connection cable retained by the retainer, the connection cable can be completely received in such a manner that no part of the received connection cable protrudes beyond the brims of the groove. Consequently, the external appearance of the electronic device can be improved. Moreover, the received connection cable is less likely to catch on a projection of another object, thereby improving the ease of handling.

According to another feature of the electronic device, the electronic device further comprises a connection cable having a flat cross-section, the connection cable being received in such the manner in the groove, wherein the outer periphery of the casing is provided with a second connector for receiving a third connector attached to the other end of the connection cable, the third connector being arranged perpendicular to a flat surface of the connection cable.

According to the electronic device having this feature, the outer periphery of the casing is provided with a second connector for receiving a third connector attached to the other end of the connection cable, thereby enabling the user to easily attach and detach the connection cable to and from the electronic device. Consequently, the electronic device is adaptable for service under various conditions that might require swapping in a longer connection cable for example.

according to another feature, the electronic device further comprises a connection cable having a flat cross-section, the connection cable being received in such the manner in the groove, wherein the other end of the connection cable is fixedly connected with the electronic device inside the casing, and the connection cable extends out of the casing.

According to the electronic device with this feature, because the other end of the connection cable is fixedly connected with the electronic device inside the casing, the connection cable cannot become detached from the electronic device due to improper operation by the user, thus affording high reliability. Additionally, it is impossible to forget to bring the connection cable when transporting the electronic device.

Further, the retainer may be in the form of a pocket capable of containing the first connector therein.

According to the electronic device with this feature, because the first connector is held received inside a pocket, the design is simple. Moreover, the user is able to detach the connector from the retainer through a simple operation.

The casing may be of polyhedral shape, and the groove may be so formed as to continuously extend over more than one face of the polyhedral surface.

According to the electronic device with this feature, because the groove is so formed as to continuously extend over more than one face of the polyhedral surface, sufficient length of the groove may be assured. The connection cable received therein can accordingly have greater length. Thus, even if the electronic device and the device to which the electronic device is to be connected are situated at locations relatively far apart, the connection cable can be connected to both devices, affording improved convenience of the electronic device. Polyhedral shaped is used herein to include cubic or cuboid shapes, polygonal columnar shapes with three or five or more sides, dome shapes, and various other polyhedral shapes; and also includes at least partially chamfered shapes.

The bottom of the groove may be smoothly curved.

According to the electronic device with this feature, because the bottom of the groove is smoothly curved, when the connection cable is received in the groove, the connection cable conforms to the shape of the groove so that the connection cable fits snugly into the groove and the connection cable does not protrude outside from the casing. Also, because the connection cable is not subjected to unnecessary force due to being bent at a sharp angle, there is no loss of durability or dependability of the connection cable.

The connection cable may be a USB cable.

The electronic device with this feature is highly universal, because the connection cable is a USB cable.

The electronic device may be a hard disk drive.

The electronic device with this feature may be provided as a hard disk drive.

According to another feature, the connection cable comprises at least a conductive member; a first sheath member of insulating material that covers the outer surface of the conductive member; and a second sheath member of insulating material that covers the outer surface of the first sheath member.

According to the electronic device with this feature, when the connection cable is twisted, acting force directed towards the untwisting direction is greater in comparison with a connection cable of single-layer construction having identical layer thickness. As a result, the connection cable may be easily untwisted after the connection cable is finished being used, providing greater convenience for the user.

According to another feature, the connection cable comprises at least a conductive member, and a sheath member that covers the outer surface of the conductive member and is made of insulating material having Shore Hardness A of 50~60.

According to the electronic device with this feature, the connection cable is easily flexed in the intended direction. The risk of the wire breaking when the cable is twisted during use may be reduced as well.

Another aspect of the present invention is directed to an electronic device housed in a casing of polyhedral shape. The electronic device comprises a casing of polyhedral shape, wherein the casing has a groove formed over more than one face of the polyhedral surface of the casing and designed to receive a connection cable used for connection with another electronic device therein, in such a manner that no part of the received connection cable protrudes beyond the brims of the groove; and the casing has a retainer in the form of a pocket, adapted to retain the connector attached to one end of the connection cable while the connection cable is being received in the groove.

According to the electronic device having this feature, with the connection cable received in the groove that is formed along the periphery of the casing and the connector that is attached to the end of the connection cable retained by the retainer, the connection cable can be completely received in such a manner that no part of the received connection cable protrudes beyond the brims of the groove. Consequently, the external appearance of the electronic device can be improved. Moreover, the received connection cable is less likely to catch against a projection of another object, thereby improving the ease of handling.

DESCRIPTION OF THE PREFERRED EMBODIMENTS

The embodiments of the present invention are now described.

A. Embodiment

A-1. Functional Arrangement of Portable Hard Disk 20

Figure 1:
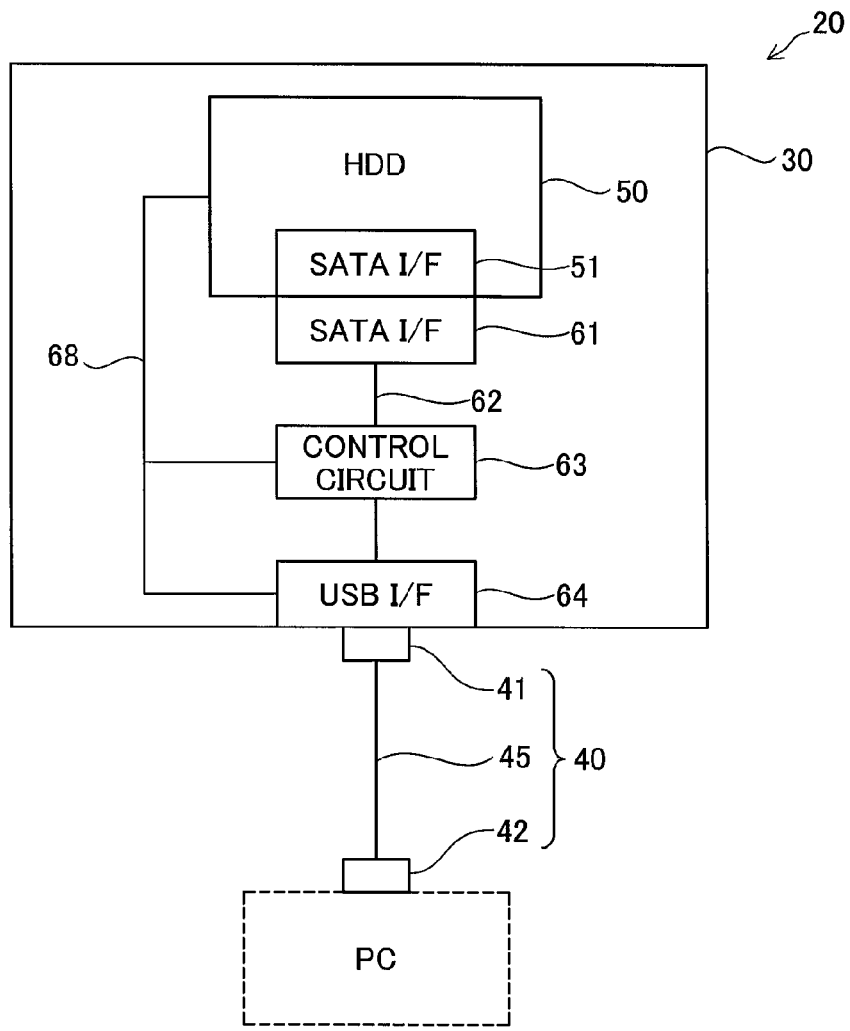
FIG. 1 is an illustration depicting the functional arrangement of a portable hard disk 20.

The general functional arrangement of a portable hard disk 20 is depicted in FIG. 1 as an embodiment of the present invention. The portable hard disk 20 is a portable, compact hard disk drive designed to connect to a personal computer PC via a connection cable 40 as depicted in the drawing. By disconnecting the connection cable 40 of the portable hard disk 20 from the personal computer PC the portable hard disk 20 and the connection cable 40 can be transported to another location. Thus, at the desired location the portable hard disk 20 can be connected for use to a personal computer PC situated at that location.

The portable hard disk 20 includes a hard disk drive (HDD) 50, a SATA (Serial Advanced Technology Attachment) interface 61, a control circuit 63, and a USB interface 64, which are connected via a bus 62 and a power supply circuit 68 and housed within an casing 30. The HDD 50 is furnished with a SATA interface 51, and the HDD 50 connects to the SATA interface 61 via the SATA interface 51. The control circuit 63 is an LSI (Large Scale Integration) that performs USB-SATA conversion, and that also controls overall operation of the portable hard disk 20. The USB interface is a Type B (in this instance, Mini-B) USB socket connector.

The connection cable 40 is a USB cable. This connection cable 40 includes a cable portion 45 and connectors 41, 42 provided at both ends. The connector 41 is a Type B (in this instance, Mini-B) USB plug connector. The connector 42 is a Type A USB plug connector. The portable hard disk 20 and the personal computer PC are connected by connecting the connector 41 to the USB interface 64 and connecting the connector 42 to the USB interface (not shown) of the personal computer PC.

Figure 2:
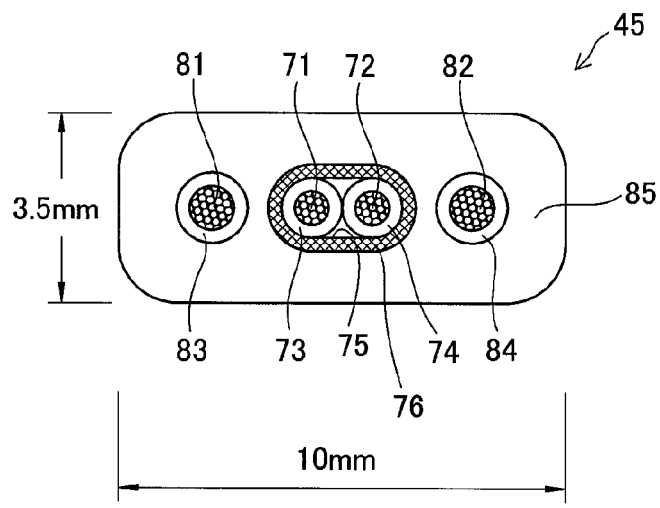
FIG. 2 is an illustration depicting cross section structure of a cable portion 45.

The cable portion 45 is a USB cable with a flattened profile. Flattened profile refers to a cable cross section in which the ratio of length in the lengthwise direction and length in the lateral direction is not equal to 1, with at least the longer of the cross section in the lengthwise direction and the lateral direction being flat. A specific example of cross section structure of the cable portion 45 is depicted in FIG. 2. As illustrated, the cable portion 45 cross section is a flattened shape 3.5 mm in length in the short side direction and 10 mm in length in the long side direction. The wire layout of the cable portion 45 is comprised of two signal wires 71, 72 (D+, D−), a power wire 81 (VBUS), and a ground wire 82 (USB-GND). The signal wires 71, 72 are respectively sheathed about the circumference by inner sheath portions 73, 74 which are insulating members; these are further bundled and sheathed by an outer conductor portion 75 made of aluminum foil wrapped around in a spiral pattern, and to the outside thereof, by a conducting mesh portion 76 consisting of a conductive member of mesh form. The power wire 81 and the ground wire 82 are respectively sheathed about the circumference by inner sheath portions 83, 84. These four wires are sheathed by an outer sheath 85 that is an insulating sheath member, thereby forming a single cable.

A-2. Shape of Portable Hard Disk Drive 20

Figure 3:
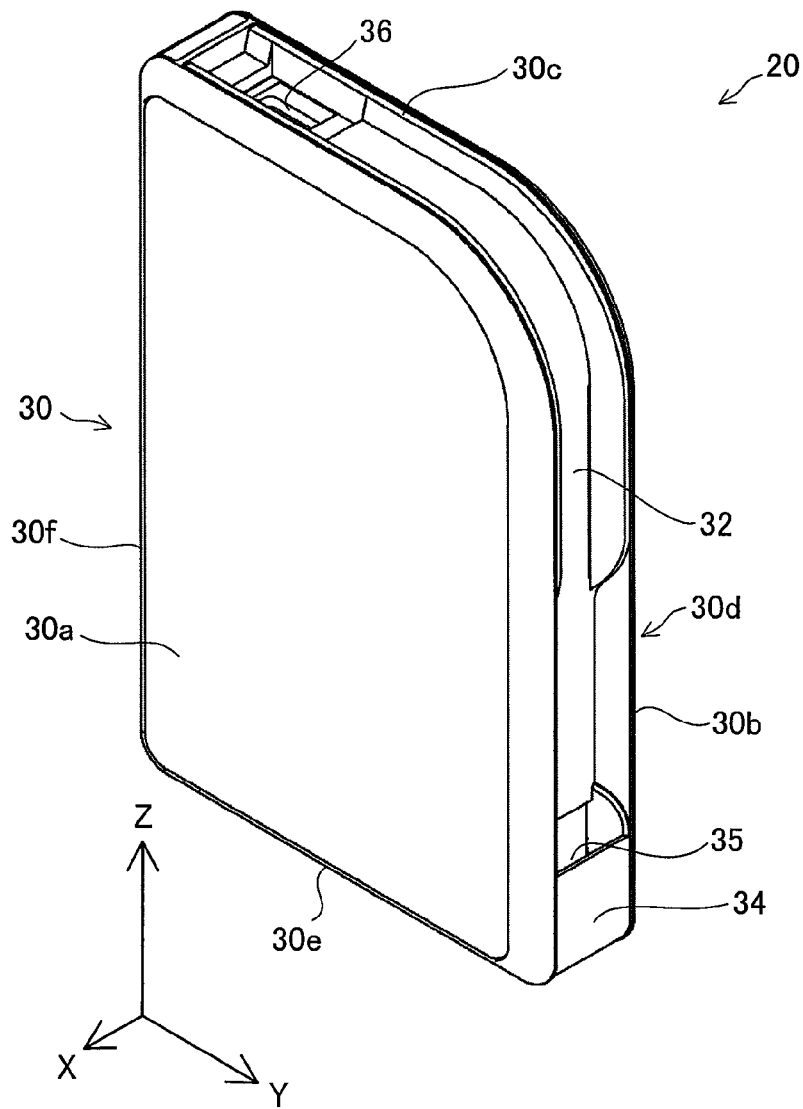
FIG. 3 is a perspective view depicting the exterior of the portable hard disk 20 (without the connection cable 40 attached)

The exterior shape of the portable hard disk 20 above is now described. FIG. 3 is a perspective view of the portable hard disk 20. The casing 30 of the portable hard disk 20 has generally cuboid shape. For convenience in description, of the faces that make up the generally cuboid shape, the opposing faces having the largest surface area are designated as a front face 30a and a back face 30b, and the side faces exclusive of these are designated as side faces 30c to 30f. No particular limitation is imposed as to shape of the casing 30, and various polygonal shapes could be employed.

As depicted in FIG. 3, the side faces 30c, 30d of the casing 30 have a groove portion 32 of groove shape extending along their lengthwise direction. In the present embodiment, the groove portion 32 extends over substantially the entire lengthwise direction of the side faces 30c, 30d. In the groove portion 32 segment of the side face 30d, at the end thereof on the opposite side from the side face 30c (the −Z direction), there is formed a cover portion 34 that blocks off the groove portion 32 along the outside edge of the side face 30d. A retainer portion 35 of pocket shape is defined by the groove portion 32 and the cover portion 34.

Figure 4:
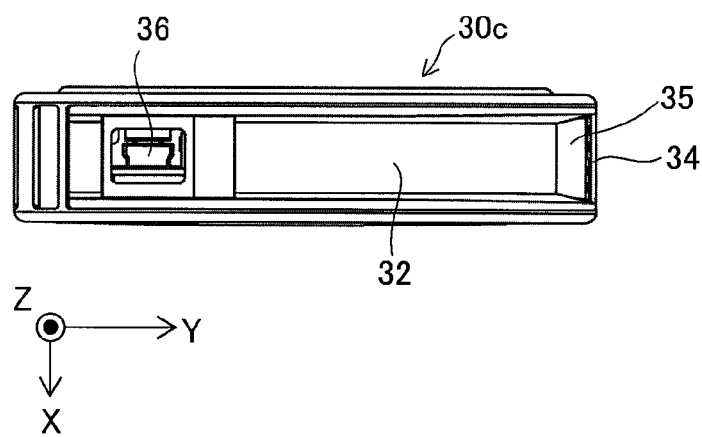
FIG. 4 is an illustration depicting a side face 30c of the portable hard disk 20 (without the connection cable 40 attached)

As depicted in FIGS. 3 and 4, a connector portion 36 is provided at the perimeter of the side face 30c of the casing 30, at the end on the opposite side from the side face 30d (the −Y direction). The connector portion 36 is a Type B (in this instance Mini-B) USB socket connector. The periphery of the connector portion 36 takes the form of a recess adapted to mate with the contours of the connector 41 of the connection cable 40 when the connector 41 is attached to the connector portion 36.

At the location of intersection of the side face 30c and the side face 30d of the casing 30, both the contours of the casing 30 and the groove portion 32 are formed with chamfered contours. The reason for adopting these contours will be discussed later.

Figure 5:
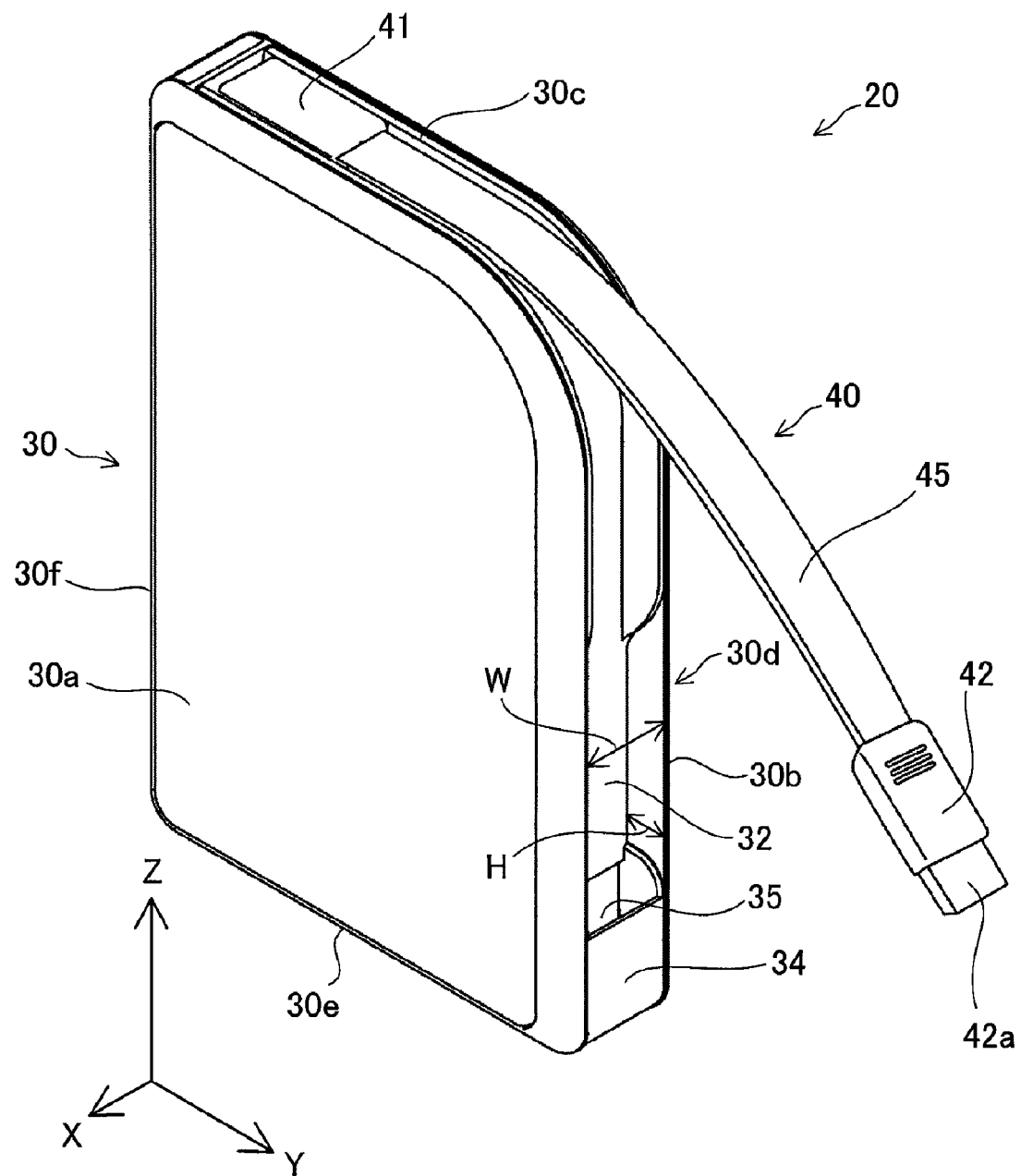
FIG. 5 is a perspective view depicting the exterior of the portable hard disk 20 (with the connection cable 40 attached)

FIG. 5 depicts the portable hard disk 20 with the connection cable 40 attached. In FIG. 5, the connector 41 provided at one end of the connection cable 40 and arranged perpendicular to the flat face of the connection cable 40 is shown attached to the connector portion 36. The connection cable 40 is connected with the relatively long flat face of its cross section facing towards the groove portion 32. By then connecting the connector 42 at the other end of the connection cable 40 to the personal computer PC, the portable hard disk 20 may be accessed from the personal computer PC.

The inside width W of the groove portion 32 is greater than the width of the connection cable 40, and its depth H is greater than the thickness of the connection cable 40. That is, the groove portion 32 has a shape such that the connection cable 40 may be stowed therein in such a manner that no part of the stowed connection cable 40 protrudes beyond the brims of the groove portion 32. In the present embodiment, the depth H is unchanging regardless of location. Stated the opposite way, the chamfered contours of the casing 30 and the groove portion 32 are formed such that the depth H is unchanging. The size of the retainer portion 35 is such that the terminal 42a at the end of the connector 42 can be slipped inside. In preferred practice the retainer portion 35 has a size that substantially mates with the terminal 42a. This is so that the terminal 42a stowed in the retainer portion 35 does not easily dislodge from the retainer portion 35.

Figure 6:
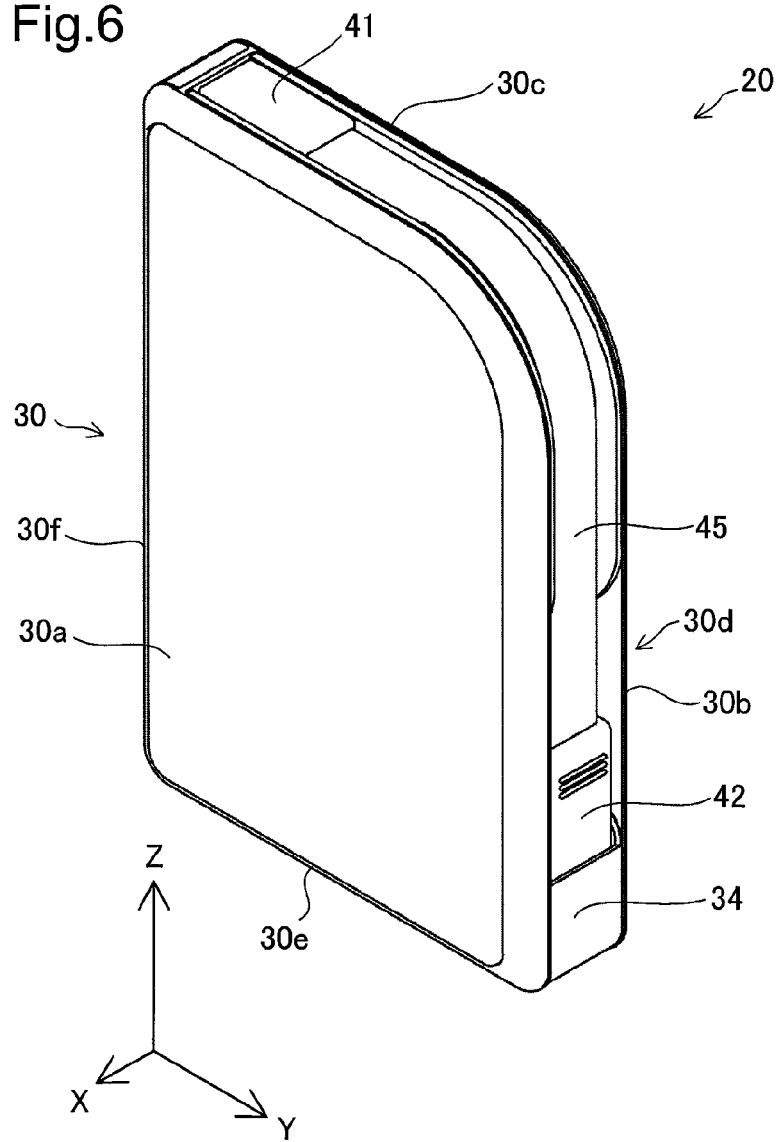
FIG. 6 is a perspective view depicting the exterior of the portable hard disk 20 (with the connection cable 40 stowed)

FIG. 6 depicts the portable hard disk 20 with the connection cable 40 attached, and additionally stowed. "Stowed" means that, from the condition depicted in FIG. 5, the terminal 42a of the connection cable 40 has now been slipped into the retainer portion 35. As illustrated, the terminal 42a slips precisely into the retainer portion 35. The length of the connection cable 40 used by the portable hard disk 20 is selected so as to make this arrangement possible. Stated the opposite way, the locations of the connector portion 36 and the retainer portion 35 are selected on the basis of the length of the connection cable 40 used, so as to make this arrangement possible.

In the present embodiment, the depth H of the groove portion 32 is established such that, with the connection cable 40 stowed in the portable hard disk 20, the edge faces of the side face 30c outside the groove portion 32 are coplanar with the outside face of the connector 41, and the edge faces of the side face 30d outside the groove portion 32 are coplanar with the outside face of the connector 42. This aspect improves the external appearance with the connection cable 40 inserted within the groove portion 32. However, it is sufficient for the depth H to be such that the entire connection cable 40 may be retained in such a manner that no part of the stowed connection cable 40 protrudes beyond the brims of the groove portion 32

According to the portable hard disk 20 having the above features, with the connector 41 of the connection cable 40 attached to the connector portion 36 and the cable portion 45 stowed in the groove portion 32, by then slipping the terminal 42a of the connector 42 into the retainer portion 35, the connection cable 40 can be kept stowed completely in such a manner that no part of the stowed connection cable 40 protrudes beyond the brims of the groove portion 32. Thus, the connection cable 40 is not protruding, and ease of handling is improved. Nor does the connection cable 40 become caught on projections of other objects during transport of the portable hard disk 20. The external appearance of the portable hard disk 20 during transport and during stowage can be improved as well.

The portable hard disk 20 has a simple design due to the fact that the connection cable 40 can be retained stowed in the groove portion 32 simply by inserting the terminal 42a into the pocket-shaped retainer portion 35. Also, the user is able to attach and detach the connector 42 to and from the retainer portion 35 by a simple operation.

Because the groove portion 32 is so formed as to continuously extend over more than one face of the casing 30, namely, the side faces 30c and 30d, the groove portion 32 can be given considerable overall length. The connection cable 40 stowed in the groove portion 32 also can be given considerable overall length as a result. Accordingly there is greater freedom with regard to the distance between the portable hard disk 20 and the personal computer PC to which the portable hard disk 20 is connected, thus affording enhanced convenience.

Also, because the portable hard disk 20 is designed so that the connector 42 may be held stowed inside the pocket-shaped retainer portion 35, and so that the groove portion 32 extends in continuous fashion over adjacent faces of the polyhedron-shaped casing 30, as compared with a design in which the groove portion is formed on a single face only, the connection cable 45 flexes more easily when the user removes the stowed connector 42 from the retainer portion 35. Thus, by pulling the flexed connection cable 45, the user can easily perform the operation of removing the connector 42 from the retainer portion 35.

Additionally, in the portable hard disk 20, because the groove portion 32 has chamfered contours, when the connection cable 40 is stowed in the groove portion 32, the cable portion 45 conforms to the shape of the groove portion 32 so that the cable portion 45 can fit precisely into the groove portion 32 without the cable portion 45 protruding out from the casing 30. Also, because the cable portion 45 is not subjected to unnecessary force due to being bent at a sharp angle, there is no loss of durability or dependability of the cable portion 45. Because the contours of the casing 30 at the location corresponding to the chamfered contours of the groove portion 32 are also chamfered, the stowed depth of the connection cable 40 in the groove portion 32 is unchanging regardless of location, affording an attractive appearance.

Additionally, because the connector portion 36 of the portable hard disk 20 is attached to the periphery of the casing 30, the user can easily attach and detach the connection cable 40 to and from the portable hard disk 20. Consequently, the portable hard disk 20 is versatile and adaptable for use according to circumstances, such as in the event the connection cable 40 must be replaced with a longer connection cable, thus affording enhanced convenience.

B: Modifications

Some modifications to the preceding embodiment are now described.

B-1. Modification 1

In the preceding embodiment, the groove portion 32 is formed across two faces of the casing 30, but no particular limitation is imposed as to the number of faces on which the groove portion 32 is formed across, and it could be formed across a single face only. For example, the groove portion 32 could be disposed on the side face 30*d* only, with the connector portion 36 and the retainer portion 35 disposed on the side face 30*d* as well. Conversely, the groove portion 32 could be formed across three or more faces. For example, the groove portion 32 could extend continuously across the side faces 30*c*, 30*d*, and 30*e*; and the connector portion 36 could be attached to the side face 30*c*, while the retainer portion 35 could be disposed on the side face 30*e*. No particular limitation is imposed as to the face or faces on which the groove portion 32 is formed; for example, the groove portion 32 could be disposed only on the front face 30*a* which has relatively large surface area, or the groove portion 32 could extend across the front face 30*a*, the side face 30*c*, and the back face 30*b*.

Whereas in the preceding embodiment, the contours of the casing 30 and the groove portion 32 are provided with a chamfered shape, a chamfered shape is not essential to provide. For example, if the cable portion 45 is highly flexible, the groove portion 32 need not have a chamfered shape. Even if the groove portion 32 has a chamfered shape, the contours of the casing 30 at the corresponding location need not have a chamfered shape. Of course, if the groove portion 32 is formed on a single face only as described above, neither the casing 30 or the groove portion 32 needs to have chamfered shape.

B-2. Modification 2

In the preceding embodiment, the location and size of the retainer portion 35 are such that the terminal 42*a* of the connection cable 40 slips precisely therein; however, the location and size of the retainer portion 35 are not limited to this embodiment, and any arrangement whereby the connector 42 can be retained to the inward side from the outside edges of the casing 30 when the cable portion 45 is stowed in the groove portion 32 would be acceptable. For example, the retainer portion 35 may be given a size such that it accommodates the entire connector 42, or a size such that it accommodates part of the cable portion 45 in addition to the entire connector 42. Alternatively, the shape of the retainer portion 35 may be a tunnel shape having openings at both ends; and the retainer portion 35 may be disposed at a location such that, when the connector 42 is inserted through one opening of the retainer portion 35, the connector 42 can be retained at a positional relationship with the terminal 42*a* protruding from the other opening of the retainer portion 35.

B-3. Modified Example 3

In the preceding embodiment, the portable hard disk 20 is designed so that the connection cable 40 is detachable, that is, the connector portion 36 is attached to the periphery of the casing 30; however, in another possible arrangement the connection cable 40 is not detachable. That is, an arrangement whereby the cable portion 45 is fixedly connected to the portable hard disk 20 inside the casing 30 but the connection cable 40 cannot be detached from the portable hard disk 20 from the outside of the casing 30 is also acceptable. This prevents the connection cable 40 from becoming detached from the portable hard disk 20 due to improper operation by the user, affording high reliability. Moreover, it is impossible to forget to bring along the connection cable 40 when transporting the portable hard disk 20.

B-4. Modification 4

In the preceding embodiment, the retainer portion 35 has a pocket shape adapted for at least partial insertion of the connector 42; however, the retainer portion 35 is not limited to such an arrangement, as long as the connector 42 can be retained to the inward side from the outside edges of the casing 30. For example, elastic members or projections may be disposed projecting out from both sides of the groove portion 32, enabling the connector 42 to be clipped therebetween; the groove portion 32 may have recessed contours that mate with the contours of the connector 42, enabling the connector 42 to be fitted within the recessed contours; or the connector 42 may be fastened in place by a strap portion attached to the side faces of the groove portion 32. In another alternative arrangement, the connector 42 may be retained by a magnet attached to the groove portion 32.

B-5. Modification 5

In the preceding embodiment, the connection cable 40 is a USB cable; however, the connection cable 40 is not limited as to type provided that it has a flattened profile. For example, the connection cable 40 may be a FireWire cable, a power cable, an optical cable, a MIDI (Musical Instrument Digital Interface) cable, or a LAN cable.

B-6. Modification 6

In the preceding embodiment, the connector 41 is designed to connect to the connection portion 36 in an unmoving manner; however, the connector 41 or the connection portion 36 could be provided with a rotating mechanism, a sliding mechanism, or other mechanism enabling the orientation of the cable portion 45 to change while the connector 41 is connected to the connection portion 36. Enhanced convenience may be afforded thereby.

B-7. Modification 7

In the preceding embodiment, the portable hard disk 20 is not provided with any special supporting member; however, the casing 30 could be provided with a stand attachment portion that allows a stand to be attached to the side face 30*e* or 30*f* for the purpose of supporting the portable hard disk 20 oriented with a relatively small face of the casing 30, e.g. the side face 30*e* or 30*f*, serving as the bottom face. The stand attachment portion may comprise for example of a screw hole for inserting the top part of the stand. Alternatively, the casing 30 may be provided with its own stand. In this case, the stand may be designed to stow to the inward side from the outside edges of the casing 30 through a sliding mechanism, a rotating mechanism, or the like. By designing the casing 30 to be supportable in this way, when the portable hard disk 20 is set up for use with a relatively small face of the casing 30 serving as the bottom face, the portable hard disk 20 can be supported in a stable manner, even if the connection cable 40 is twisted.

B-8. Modification 8

While the preceding embodiment describes a portable hard disk 20 as one mode of the electronic device of the present invention, the electronic device of the invention is not limited to a portable hard disk 20, and may be a hard disk case for example. A hard disk case is an electronic device that accommodates installation of a desired hard disk drive, and that when connected to the hard disk drive functions as a portable hard disk; for example, an arrangement similar to that of FIG. 1, but with the HDD 50 omitted.

Nor is the electronic device of the present invention limited to hard disk drive-related devices, but is adaptable to various other types of electronic devices such as SSD (Solid State Drives), CD drives, DVD drives, Blu-Ray drives, speakers, PDA (Personal Digital Assistants), printer servers, printers, power adapters, modems, One-Seg receivers, digital broadcast devices, hub devices, and so on.

Also, while the preceding embodiment shows a feature whereby the connection cable is designed to stow in the device (in the embodiment, the portable hard disk 20), this feature could be implemented in the host device (in the embodiment, the personal computer PC) instead. Such a host device could be a PDA or mobile phone, for example.

C. Alternative Embodiments of the Connection Cable

Figure 7:
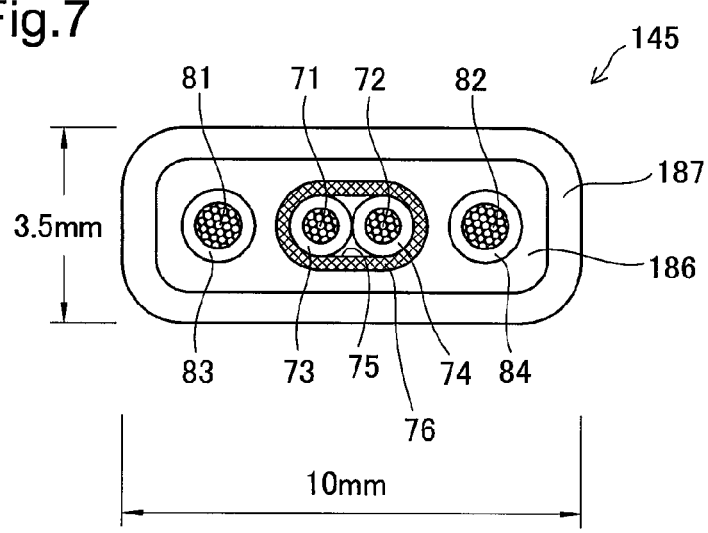
FIG. 7 is an illustration depicting cross section structure of a cable portion 145 in another embodiment.

Another embodiment of the cable portion of the connection cable is depicted as cable portion 145 in FIG. 7. FIG. 7 depicts the cable portion 145 in cross section, with features that are comparable to those in FIG. 2 being assigned the same symbols as in FIG. 2. The wire layout of the cable portion 145 is comprised of two signal wires 71, 72 (D+, D−), a power wire 81, and a ground wire 82. The signal wires 71, 72 are respectively sheathed about the circumference by inner sheath portions 73, 74 which are insulating members; these are further bundled and sheathed by an outer conductor portion 75 made of aluminum foil wrapped around in a spiral pattern, and to the outside thereof, by a conducting mesh portion 76 consisting of a conductive member of mesh form. In the present embodiment, the signal wire 71 and the signal wire 72 have twisted pair construction. However, it is not necessary for the signal wire 71 and the signal wire 72 to have twisted pair construction. The power wire 81 and the ground wire 82 are respectively sheathed about the circumference by inner sheath portions 83, 84.

These four wires are in turn sheathed by an outer sheath 186 that is an insulating sheath member, and then to outside thereof by another outer sheath 187, thereby forming a single cable. That is, the outer sheath that sheathes the signal wires 71, 72, the power wire 81, and the ground wire 82 has a double-layer structure. The outer sheath 186 and the outer sheath 187 are not bonded together with an adhesive or the like; rather, in the present embodiment, the outer sheath 187 is extrusion molded about the circumference of the outer sheath 186.

In the cable portion 145 having the above construction, wires of identical structure, i.e. the signal wire 71 and the signal wire 72 on the one hand, and the power wire 81 and the ground wire 82 on the other, are arranged symmetrically about an axis of symmetry coincident with the lengthwise center axis of the cross section of the cable portion 145. Also, all of the wires are arranged symmetrically about an axis of symmetry coincident with the center axis of the short sides of cross section of the cable portion 145, in other words, so that the wires which are lined up on a straight line in the long side direction are situated in the center part in the short side direction.

In this type of cable, i.e. one with a flattened profile having differing lengths in the vertical direction and the horizontal direction of the cross section of the cable and in which at least the cross sectional profile of the longer of the vertical direction and the horizontal direction is flat, by adopting an arrangement furnished with a conducting member, a first sheath portion (outer sheath 186) which is an insulating member disposed covering the perimeter of the cross section of the conducting member, and a second sheath portion (outer sheath 187) which is an insulating member disposed covering the perimeter of the cross section of the first sheath portion, the cable can be endowed with a higher level of acting force acting in the direction of untwisting when the cable has become twisted, as compared to a cable of single-layer structure of equivalent thickness. As a result, when the cable is finished being used, the cable can be untwisted easily, affording improved user convenience. The design of the insulating member that sheathes the periphery of the cross section of the conducting member is not limited to two-layer construction, and comparable effects are afforded by multilayer constructions of three or more layers. By adopting a symmetric arrangement for the wires that make up the cable, the way the cable twists and untwists will be uniform regardless of the direction in which the cable portion 145 is twisted.

Figure 8:
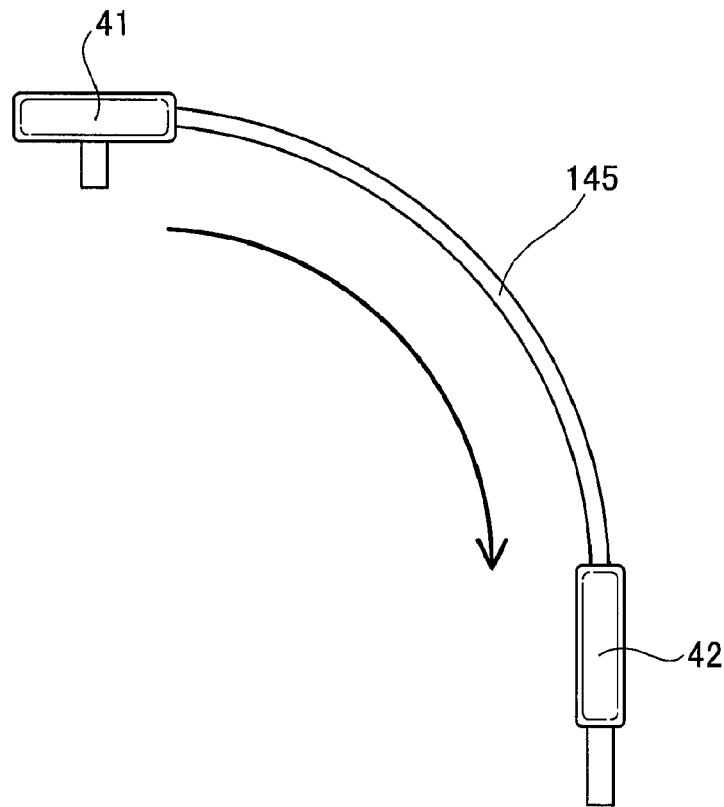
FIG. 8 is an illustration depicting an example of the cable portion 145 when flexed.
Figure 9:
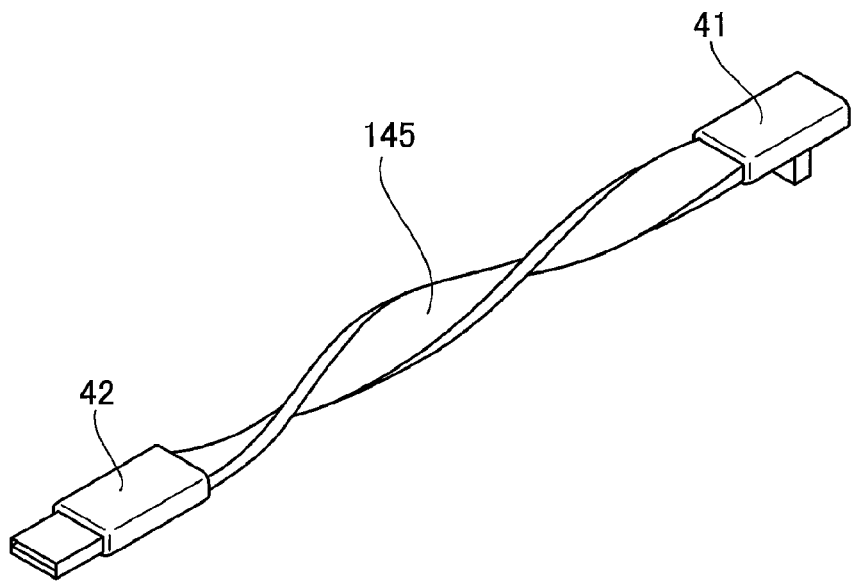
FIG. 9 is an illustration depicting an example of the cable portion 145 when twisted.

Materials having a prescribed combination of flexibility and rigidity may be used for the outer sheaths 186, 187. In the present embodiment, PVC (polyvinyl chloride) is used for the outer sheath 186 and the outer sheath 187. Shore Hardness A of PVC may preferably be about 50 to 60. By employing PVC with PVC Shore Hardness A of about 50 to 60 as the material for the first sheath portion (the outer sheath 186) and for the second sheath portion (the outer sheath 187), the cable portion 145 is easy to flex in the desired direction as depicted in FIG. 8. Also, the risk of wire breakage is lower, even when the cable portion 145 is used twisted as depicted in FIG. 9. In the present embodiment, Shore Hardness A is measured in accordance with the JIS K6253 standard.

The material for the outer sheaths 186, 187 is not limited to PVC; silicone rubber, TPE (thermoplastic elastomers) or the like could be used as well. Regardless of whether the material for the outer sheaths 186, 187 is PVC, silicone rubber, or TPE, it is preferable for the Shore Hardness A to be about 50 to 60. The outer sheath 186 and the outer sheath 187 are not limited to the same material, and may be made of different materials. For example, a material with relatively high flexibility may be used for the outer sheath 186 while using a material with relatively low flexibility for the outer sheath 187, in order to control the overall flexibility of the outer sheaths 186, 187. The aforementioned advantages of ease of flexing and reduced wire breakage can be attained even if the outer sheath covering the signal wires 71, 72, the power wire 81, and the ground wire 82 has single-layer construction.

Figure 10:
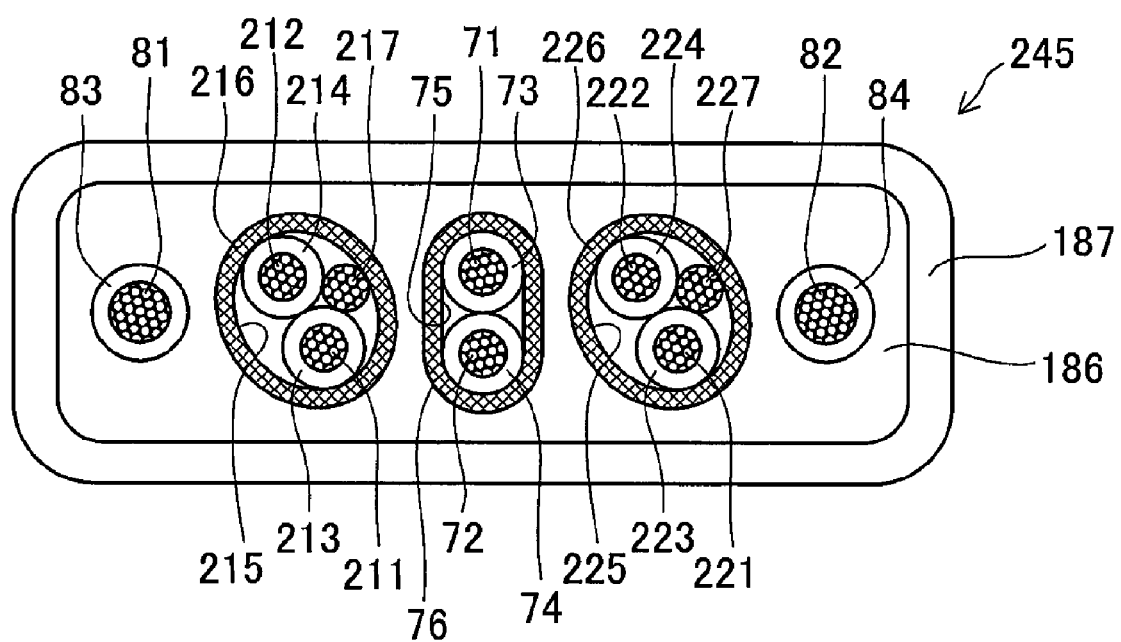
FIG. 10 is an illustration depicting cross section structure of a cable portion 245 in another embodiment.

Yet another embodiment of the cable portion different from the cable portion 145 is depicted as cable portion 245 in FIG. 10. FIG. 10 depicts the cable portion 245 in cross section, with features that are comparable to those in FIG. 2 being assigned the same symbols as in FIG. 2, omitting the description. The cable portion 245 is a cable compliant with the USB 3.0 standard; the wire layout is comprised of six signal wires 71, 72 (D+, D−), 211, 212 (1+, 1−), 221, 222 (2+, 2−), drain wires 217, 227, a power wire 81, and a ground wire 82.

The signal wires 71, 72 are sheathed by inner sheath portions 73, 74, and in turn are sheathed by an outer conductor portion 75 and a conducting mesh portion 76. The signal wires 211, 212 and the signal wires 221, 222 are full-duplex signal wires used for SuperSpeed mode. The signal wires 211, 212 are sheathed about the circumference by inner sheath portions 213, 214; these, together with the drain line 217, are then sheathed by an outer conductor portion 215 and a conducting mesh portion 216. The inner sheath portions 213, 214, the outer conductor portion 215, and the conducting mesh portion 216 correspond respectively to the inner sheath portions 73, 74, the outer conductor portion 75, and the conducting mesh portion 76. Similarly, the signal wires 211, 212 are sheathed about the circumference by inner sheath portions 223, 224; these, together with the drain line 227, are then sheathed by an outer conductor portion 225 and a conducting mesh portion 226. The inner sheath portions 223, 224, the outer conductor portion 225, and the conducting mesh portion 226 correspond respectively to the inner sheath portions 73, 74, the outer conductor portion 75, and the conducting mesh portion 76. In the present embodiment, the signal wire 71 and the signal wire 72, the signal wire 211 and the signal wire 212, and the signal wire 221 and the signal wire 222 respectively have twisted pair construction. However, it is not necessary that they have twisted pair construction.

The power wire 81 and the ground wire 82 are respectively sheathed about the circumference by inner sheath portions 83, 84. These wires are in turn sheathed by an outer sheath 186 that is an insulating sheath member, and then to the outside thereof by an outer sheath 187, forming a single cable. Like the cable portion 145, the material of the outer sheaths 186, 187 is PVC. Also, like the cable portion 145, the outer sheaths can be of single-layer or multilayer construction.

Like the cable portion 45 and the cable portion 145 described previously, in the cable portion 245, groups of wires of identical structure are arranged generally symmetrically about axes of symmetry coincident with the center axes of the long sides and the short sides of the cross section of the cable portion 145. The groups of wires may be arranged so as to be completely symmetrical. The cable portion 245 having the above structure affords various advantages comparable to those of the cable portion 145 shown in FIG. 7.

Among the various constituents and components included in the embodiments of the invention discussed above, those other than the constituents and components included in independent claims are additional and supplementary elements and may be omitted according to the requirements. The embodiments and their modifications and applications discussed above are to be considered in all aspects as illustrative and not restrictive. There may be many other modifications, changes, and alterations without departing from the scope or spirit of the main characteristics of the present invention.

What is claimed is:

1. An electronic device comprising: a casing and a connection cable having a flat cross-section, wherein
   the casing has a groove formed along the periphery of the casing and designed to receive the connection cable having a flat cross-section therein, in such a manner that no part of the received connection cable protrudes beyond the brims of the groove; and
   a retainer adapted to retain a first connector attached to one end of the connection cable while the connection cable is being received in the groove;
   wherein the outer periphery of the casing is provided with a second connector for receiving a third connector attached to the other end of the connection cable, the third connector of the connection cable being arranged perpendicular to a flat surface of the connection cable.

2. An electronic device as claimed in claim 1, wherein the connection cable comprises at least
   a conductive member;
   a first sheath member of insulating material that covers the outer surface of the conductive member; and
   a second sheath member of insulating material that covers the outer surface of the first sheath member.

3. An electronic device as claimed in claim 1, wherein the retainer is in the form of a pocket capable of containing the first connector therein.

4. An electronic device as claimed in claim 1, wherein
   the casing is of polyhedral shape; and
   the groove is so formed as to continuously extend over more than one face of the polyhedral surface.

5. An electronic device as claimed in claim 4, wherein the bottom of the groove is smoothly curved.

6. An electronic device as claimed in claim 4, wherein the electronic device is a hard disk drive.

7. An electronic device as claimed in claim 1, wherein the second connector is a socket connector forming a recess in the casing adapted to mate with the contours of the third connector of the connection cable so that the connection cable is detachably attached to the electronic device.

8. An electronic device as claimed in claim 1, wherein the connection cable is a USB cable.

9. The electronic device as claimed in claim 8, wherein the first connector of the USB cable is a USB plug connector arranged parallel to the flat surface of the USB connection cable and the third connector of the USB cable is a plug connector arranged perpendicular to the flat surface of the USB connection cable, wherein the second connector is a USB socket connector forming a recess in the casing adapted to mate with the contours of the third connector of the connection cable so that the connection cable is detachably attached to the electronic device.

10. An electronic device as claimed in claim 8, wherein the USB connection cable comprises at least
    a conductive member; and
    a sheath member that covers the outer surface of the conductive member and is made of insulating material having Shore Hardness A of 50~60.

11. An electronic device comprising: a casing of polyhedral shape and a connection cable having a flat cross-section used for connection with another electronic device, wherein
    the casing has a groove formed over more than one face of the polyhedral surface of the casing and designed to receive the connection cable therein, in such a manner that no part of the received connection cable protrudes beyond the brims of the groove; and
    a retainer in the form of a pocket, which is formed by blocking off the groove partially, adapted to retain a first connector attached to one end of the connection cable while the connection cable is being received in the groove;
    wherein the outer periphery of the casing is provided with a second connector for receiving a third connector attached to the other end of the connection cable, the third connector of the connection cable being arranged perpendicular to a flat surface of the connection cable.

12. An electronic device as claimed in claim 11, wherein the second connector is a socket connector forming a recess in the casing adapted to mate with the contours of the third connector of the connection cable so that the connection cable is detachably attached to the electronic device.

13. An electronic device as claimed in claim 11, wherein the connection cable is a USB cable.

14. The electronic device as claimed in claim 13, wherein the first connector of the USB cable is a USB plug connector arranged parallel to the flat surface of the USB connection cable and the third connector of the USB cable is a plug connector arranged perpendicular to the flat surface of the USB connection cable, wherein the second connector is a USB socket connector forming a recess in the casing adapted to mate with the contours of the third connector of the connection cable so that the connection cable is detachably attached to the electronic device.

15. An electronic device comprising:
   a casing, wherein the casing has a groove formed along the periphery of the casing and designed to receive a USB connection cable having a flat cross-section therein, in such a manner that no part of the received connection cable protrudes beyond the brims of the groove;
   the USB connection cable having a first connector attached to one end of the connection cable and a third connector attached to the other end of the USB connection cable, the third connector having a plug oriented perpendicular to a flat surface of the USB connection cable, and
   a retainer adapted to retain the first connector of the USB connection cable while the USB connection cable is being received in the groove;
   wherein the outer periphery of the casing is provided with a second connector that is a slot connector forming a recess for receiving the plug of the third connector of the USB connection cable so that the USB connection cable is detachably mated to the electronic device to permit the USB connection cable to be swapped.

16. An electronic device as claimed in claim 15, wherein the connection cable comprises at least
   a conductive member;
   a first sheath member of insulating material that covers the outer surface of the conductive member; and
   a second sheath member of insulating material that covers the outer surface of the first sheath member.

* * * * *